(12) United States Patent
Leistad et al.

(10) Patent No.: US 9,257,969 B2
(45) Date of Patent: Feb. 9, 2016

(54) FREQUENCY LOCKING OSCILLATOR

(71) Applicant: Atmel Corporation, San Jose, CA (US)

(72) Inventors: Tor Erik Leistad, Trondheim (NO); Frode Milch Pedersen, Trondheim (NO); Fredrik Larsen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 72 days.

(21) Appl. No.: 13/632,738

(22) Filed: Oct. 1, 2012

(65) Prior Publication Data
US 2013/0027103 A1 Jan. 31, 2013

Related U.S. Application Data

(62) Division of application No. 12/885,390, filed on Sep. 17, 2010, now Pat. No. 8,279,015.

(51) Int. Cl.
| | |
|---|---|
| H03L 7/06 | (2006.01) |
| H03K 3/03 | (2006.01) |
| H03K 3/011 | (2006.01) |
| H03L 7/099 | (2006.01) |
| H03L 7/183 | (2006.01) |
| H03K 5/14 | (2014.01) |
| H03L 7/081 | (2006.01) |

(52) U.S. Cl.
CPC .............. *H03K 3/0315* (2013.01); *H03K 3/011* (2013.01); *H03L 7/0997* (2013.01); *H03L 7/183* (2013.01); *H03K 5/14* (2013.01); *H03L 7/0814* (2013.01)

(58) Field of Classification Search
CPC ....... H03K 5/14; H03K 3/0315; H03K 3/011; H03L 7/0814; H03L 7/183; H03L 7/0997
USPC .............. 327/149, 151, 158, 160; 331/44, 57, 331/135
See application file for complete search history.

(56) References Cited

U.S. PATENT DOCUMENTS

| | | | |
|---|---|---|---|
| 4,611,337 A * | 9/1986 | Evans ........................... | 377/123 |
| 5,374,860 A | 12/1994 | Llewellyn | |
| 6,389,091 B1 | 5/2002 | Yamaguchi et al. | |
| 6,570,815 B2 * | 5/2003 | Kashiwazaki ........... | 365/233.17 |
| 7,234,069 B1 * | 6/2007 | Johnson ........................ | 713/400 |
| 7,414,483 B2 * | 8/2008 | Shimamoto ...................... | 331/44 |
| 8,058,891 B2 * | 11/2011 | Hasumi et al. ........... | 324/762.01 |
| 2002/0053048 A1 * | 5/2002 | Matsumoto et al. .......... | 714/100 |

OTHER PUBLICATIONS

"Delay-locked loop," Wikipedia [online], Jun. 24, 2010, <URL: http://www.en.wikipedia.org/wiki/Delay-locked_loop> [retrieved Sep. 6, 2010], 2 pages.
"Delay line oscillator," Wikipedia [online], Apr. 17, 2009, <URL:http://www.en.wikipedia.org/wiki/Delay_line_oscillator> [retrieved Sep. 6, 2010], 2 pages.

\* cited by examiner

*Primary Examiner* — Richard Tan
(74) *Attorney, Agent, or Firm* — Fish & Richardson P.C.

(57) ABSTRACT

A delay line of individually selectable delay elements can operate as an oscillator in an open loop mode to track process variation or drive a clock signal that varies with temperatures and voltages in the system. The delay line oscillator can also operate in a closed loop mode to match a frequency given by a tuner ratio and a reference clock. The delay line can also be used for measuring clock jitter or duty cycle.

20 Claims, 6 Drawing Sheets

FREQUENCY LOCKING OSCILLATOR

CROSS-REFERENCE TO RELATED APPLICATIONS

This application is a divisional of U.S. application Ser. No. 12/885,390, filed on Sep. 17, 2010, the disclosure of which is expressly incorporated herein by reference in its entirety.

TECHNICAL FIELD

This subject matter is generally related to electronics, and more particularly to digital oscillators.

BACKGROUND

Electronic oscillators are used in digital electronics to produce clock signals that are used to coordinate operations performed by various digital electronic components. An example of an electronic oscillator is a voltage controlled oscillator (VCO). A VCO produces an output signal with a frequency that varies based on applied direct current (DC) voltage. Typical electronic oscillators with tuning capabilities are made with analog components that can use a significant amount of area on an integrated circuit die.

SUMMARY

A delay line of individually selectable delay elements can operate as an oscillator in an open loop mode to track process variation or drive a clock signal that varies with temperatures and voltages in the system. The delay line oscillator can also operate in a closed loop mode to match to a frequency given by a tuner ratio and a reference clock. The delay line can also be used for measuring clock jitter or duty cycle.

Various implementations of the subject matter described herein may provide one or more of the following advantages: (1) an oscillator may be made using standard cell digital components at a lower cost (e.g., using a smaller area on an integrated circuit) because some or all analog components can be replaced with digital components; (2) the oscillator may be designed into various systems more easily because manual layout of analog components is not required; (3) the oscillator may be used to increase performance in digital circuits by providing a clock with a frequency that scales with the logic speed as temperature and voltage vary, (4) the oscillator may be tested using scan testing; and (5) a delay line may be used as an oscillator or as a delay tool to measure jitter or duty cycle of a reference clock.

DETAILED DESCRIPTION

System Overview

Figure 1:
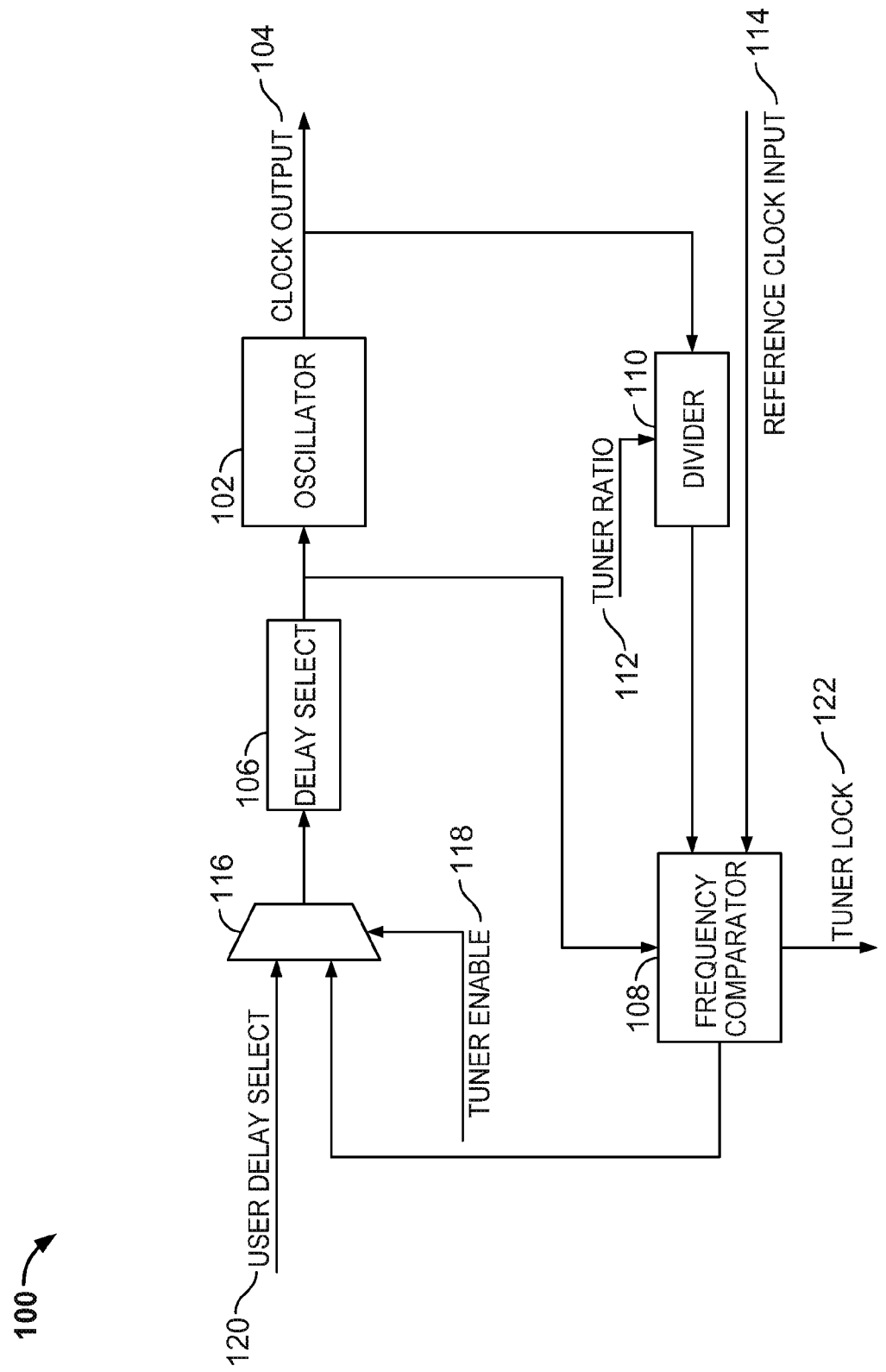
FIG. 1 is a block diagram of an example system including a frequency locking oscillator based on a digital delay line.

FIG. 1 is a block diagram of an example system 100 including a frequency locking oscillator 102 based on a digital delay line. The system 100 can be embedded in a microcontroller, e.g., as a reusable unit of logic, a cell, or chip layout design. The oscillator 102 provides an output clock signal on a clock output 104. The frequency of the output clock signal is selectable. The frequency is set by a value stored in a delay select register 106.

When the oscillator 102 is operating in an open loop mode, a value is set to the delay select register 106 to specify a frequency for the output clock signal. The value is used by the oscillator 102 to adjust the length of a delay path through a delay line in the oscillator 102. The length of the delay line determines the frequency of the output clock signal. The frequency of the output clock signal also depends on temperature of the system 100 and the voltages applied to the system 100.

When the oscillator 102 is operating in a closed loop mode, the frequency is controlled by a tuner. The tuner includes a frequency comparator 108 and a frequency divider 110. The frequency divider 110 receives the output clock signal from the oscillator 102 and a tuner ratio value on a tuner ratio input 112. The frequency divider 110 provides as output to the frequency comparator 108 a signal having a frequency of the output clock signal divided by the tuner ratio value. The frequency comparator 108 receives the signal having the frequency of the output clock signal divided by the tuner ratio value and a reference clock signal at a reference clock input 114. The reference clock signal is provided by another oscillator, for example, a system level clock signal from a quartz oscillator.

The frequency comparator 108 also receives the value set in the delay select register 106, and can adjust the value set in the delay select register 106 (e.g., through an output coupled to the delay select register through a multiplexer 116.) If the frequency comparator 108 determines that the frequency of the output clock needs to be increased for the frequency divided by the tuner ratio to match the frequency of the reference clock, then the frequency comparator 108 adjusts the value set in the delay select register 106 to increase the frequency of the oscillator 102 (typically by decreasing the value set in the delay select register 106). If the frequency comparator 108 determines that the frequency of the output clock needs to be decreased for the frequency divided by the tuner ratio to match the frequency of the reference clock, then the frequency comparator 108 adjusts the value set in the delay select register to decrease the frequency of the oscillator 102 (typically by increasing the value set in the delay select register 106).

In some implementations, the frequency comparator 108 adjusts the value set in the delay select register 106 to add or remove delay elements one at a time (e.g., once each clock cycle.) In some other implementations, the frequency comparator 108 adjusts the value set in the delay select register 106 by an amount based on the difference between the frequency of the output lock divided by the tuner ratio and the frequency of the reference clock. For example, the frequency comparator 108 may perform a binary search.

An optional multiplexer 116 allows the system 100 to be used in either open loop mode or closed loop mode depending on a value set at a tuner enable input 118. If the value at the tuner enable input 118 configures the multiplexer 116 to select a delay select value output from the frequency comparator 108, then the oscillator 102 will run in the closed loop mode and match the frequency of the reference clock multiplied by the tuner ratio. If the value at the tuner enable input 118 configures the multiplexer 116 to select a user delay select input 120, the oscillator will run in the open loop mode and match a frequency according to a value provided on the user delay select input 120.

An optional tuner lock output 122 indicates whether the tuner is still adjusting the length of the delay line to match the frequency of a signal on the reference clock input 114 multiplied by the tuner ratio value on the tuner ratio input 112. For example, the tuner lock output 122 may provide a low signal while the tuner is adjusting the delay line and provide a high signal after the tuner has matched the length of the delay line.

Example Oscillator

Figure 2:
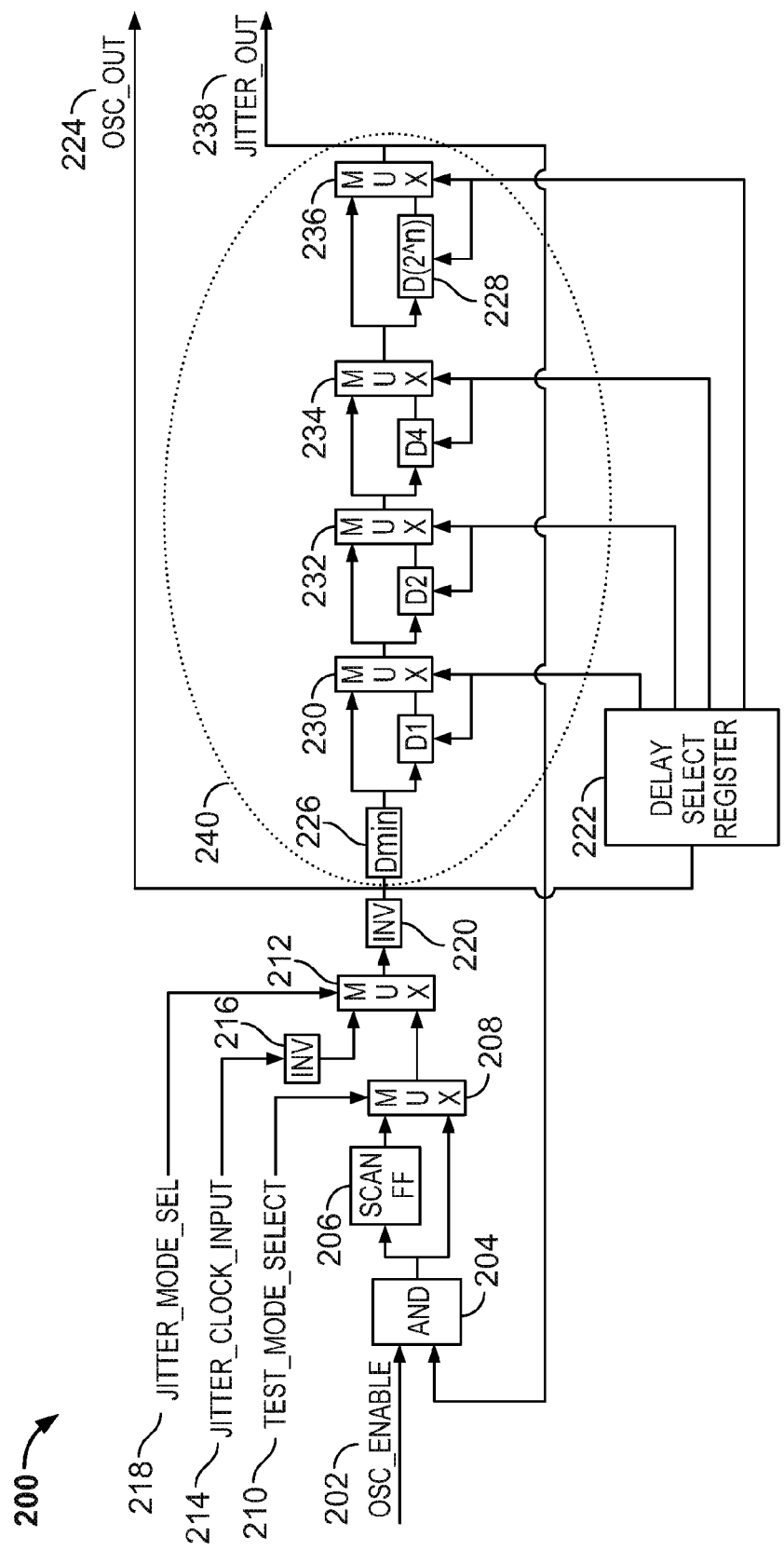
FIG. 2 is a schematic diagram of an example delay line oscillator.

FIG. 2 is a schematic diagram of an example delay line oscillator 200. The delay line oscillator 200 can be used, for example, as the frequency locking oscillator 102 of FIG. 1. The delay line oscillator 200 comprises a delay line 240 of delay elements $D1$-$D_{2^n}$. The delay elements can be standard cells selected from a library of standard cells.

A signal 202 (OSC_ENABLE) is used as an on/off switch to enable and disable the oscillator 200. The signal 202 enters a first input of an AND gate 204. If the signal 202 is set high, the oscillator 200 will oscillate. The other input of the AND gate 204 receives a signal from the output of the last delay element in the delay line 240.

In some implementations, the oscillator 200 includes a scanning flip-flop 206 to enable scan testing of the oscillator 200. Implementations that include the scanning flip-flop 206 can also include a multiplexer 208 to enable or disable scan testing. The multiplexer 208 includes a first input from the scanning flip-flop 206 and a second input from the output of the AND gate 204. The multiplexer 208 receives a signal 210 (Test_Mode_Select signal). When the signal 210 is set high, the multiplexer 212 selects the output of the scanning flip-flop 206. When the signal 210 is set low, the multiplexer selects the output of the AND gate 204.

In some implementations, the oscillator 200 is configured to measure jitter or duty cycle of a clock signal. In those implementations, the oscillator 200 includes a multiplexer 212 to select either a signal 214 (Jitter_Clock_Input) or the signal output from the last delay element in the delay line 240 (e.g., from the output of AND gate 204 or the previous multiplexer 208). The signal 214 can be inverted by an inverter 216. The multiplexer 212 receives a signal 218 (Jitter_Mode_Select signal). When the signal 218 is set high, the multiplexer 212 selects the inverted signal 214. When the signal 218 is set low, the multiplexer 212 selects the signal from the output of the last delay element in the delay line 240.

Figure 3:
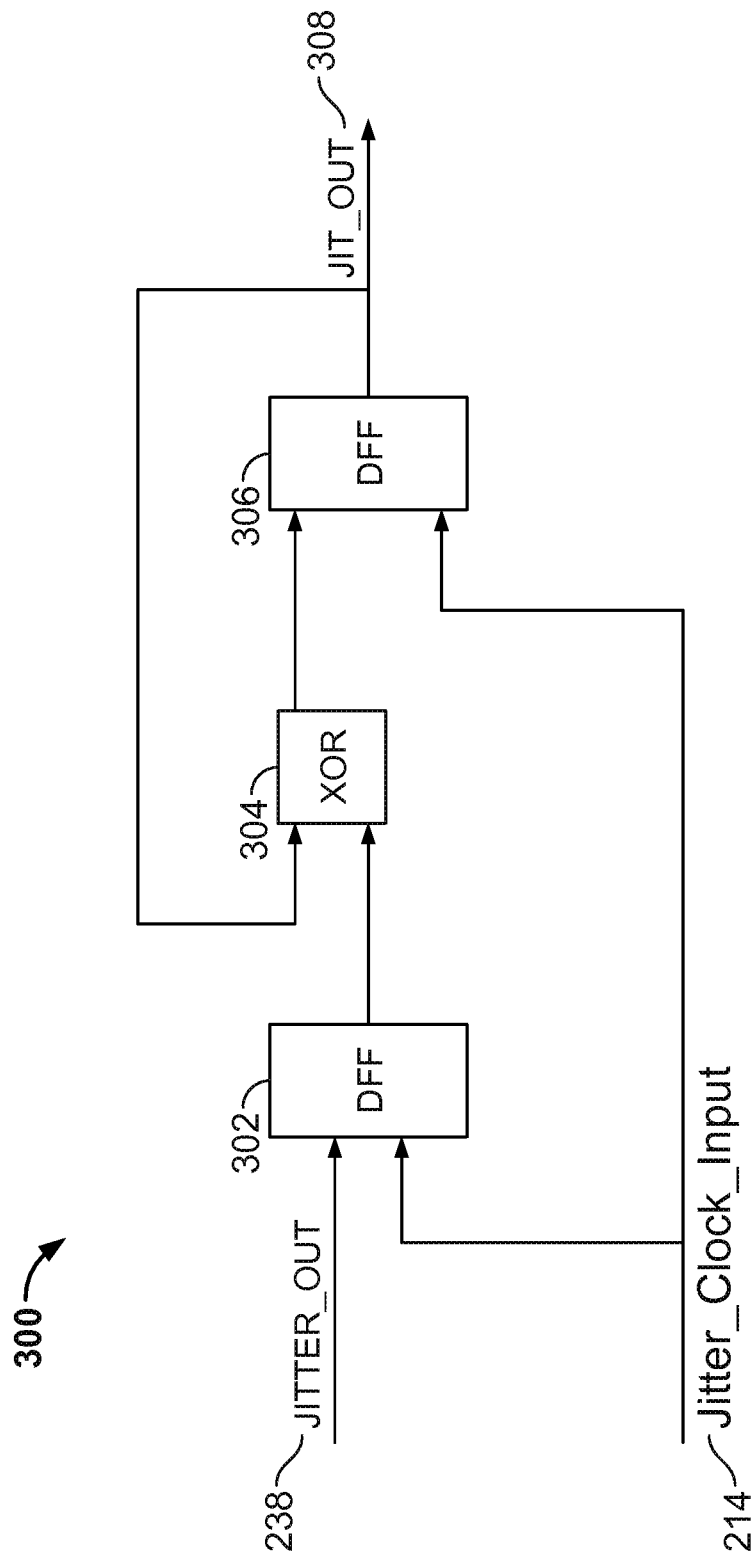
FIG. 3 is a schematic diagram of an example counting circuit.

In implementations where the oscillator 200 is configured to measure jitter or duty cycle, the oscillator 200 can be coupled to the circuit 300 illustrated in FIG. 3. The circuit 300 is discussed further below with reference to FIG. 3. Example methods for measuring jitter and duty cycle are discussed further below with reference to FIG. 6.

In some implementations, an inverter 220 receives a signal and provides an inverted signal to the delay line 240. As shown, the inverter 220 receives a signal from the multiplexer 212 that selects whether or not the oscillator 200 will measure jitter or duty cycle. Alternatively, the inverter 220 receives the signal from the output of the AND gate 204 or the multiplexer 208 that selects whether or not the oscillator 200 will be operated in a scan test mode. The output of the inverter 220 can be coupled to a delay select register 222 to provide a clock for the delay select register 222.

The output of the inverter can also be used as a clock signal 224 (OSC_OUT) for a target device. For example, the target device may be a microcontroller. In some implementations, the target device comprises standard cells selected from the same library of standard cells used for the oscillator 200. This is useful, for example, when the oscillator 200 is operating in an open loop mode so that the frequency of the clock signal on OSC_OUT 224 varies with the temperature and voltage in the oscillator 200. The oscillator 200 can maximize performance of the target device in open loop mode because the clock signal will have a higher frequency when the temperature is lower and a lower frequency when the temperature is higher.

The delay line 240 includes delay elements $D_1$-$D_{2^n}$ connected in a cascade from a first delay element 226 (Dmin) to a last delay element 228 ($D_{2^n}$). Each delay element can include one or more standard cells. A delay element may be, for example, an even number of inverters connected end to end. Each delay element time delays a signal at its input by a time period.

The delay elements after the first delay element 226 are individually selectable to be included in a delay path through the delay line by selecting elements, e.g., multiplexers 230-236. The delay path is defined by the delay elements that are selected by the multiplexers 230-236. The multiplexers 230-236 are each coupled to the delay select register 222. The delay select register 222 stores a value indicative of the total delay of the delay line. Based on that total delay value, the delay select register 222 outputs signals to the multiplexers 230-236 to configure each multiplexer to either add or remove the multiplexer's respective delay element from the delay path.

The first delay element 226 (Dmin) can be configured to time delay a signal by a minimum time delay. The minimum time delay can be longer than a time delay between the delay select register 222 and the outputs of the multiplexers 230-236. The time delay can be given by the time required to update the delay select register 222 and propagate the outputs from the delay select register 222 to the multiplexers 230-236.

In some implementations, each delay element after the first delay element 226 can be configured so that its time delay is twice as long as the delay element prior to it in the cascade. For example, the time period for D2 can be twice that of D1, the time period for D3 can be twice that of D2, and so on. The time period for D1 can be unrelated to the time period for Dmin; for example, the time period for Dmin can be longer than any other delay element in the delay line 240. The time period for the last delay element 228 is $2^n$ times the time period for D1, where n is the number of delay elements after the first delay element 226 in the delay line 240. These implementations limit the number of multiplexers required while keeping the range of possible delays (and thus frequencies) at a maximum.

Although a tuner is not shown in FIG. 2, the oscillator 200 can be used with a tuner to run in a closed loop mode as described with reference to FIG. 1. In some implementations, each delay element can be non-inverting. Using non-inverting delay elements is useful, for example, when the oscillator 200 is operated in a closed loop mode. The non-inverting delay elements, the delay select register 222 and the multiplexers 230, 236 allow on-the-fly changes to the length of the delay path through the delay line 240 without introducing glitches on the clock signal 224.

Example Counting Circuit

FIG. 3 is a schematic diagram of an example counting circuit 300. The counting circuit 300 is used with the oscillator 200 of FIG. 2 to measure jitter or duty cycle of a clock signal when the oscillator 200 is configured to operate in a measurement mode.

The counting circuit 300 includes a first flip-flop 302 (e.g., a D flip-flop) clocked by the Jitter_Clock_Input signal 214 and receiving the signal 238 (JITTER_OUT) from the delay line 240. The output of the first flip-flop 302 is coupled to an input of XOR gate 304. The output of the XOR gate 304 is coupled to a second flip-flop 306. The second flip-flop 306 is clocked by the signal 214 (Jitter_Clock_Input). The output of the second flip-flop 306, the signal 308 (JIT_OUT), is coupled to the other input of the XOR gate 304. When a high value is captured on the first flip-flop 302, the second flip-flop 306 will toggle.

In some implementations, the signal 308 is coupled to a frequency meter circuit configured to measure the number of times that the second flip-flop toggles over a given number of clock cycles of the Jitter_Clock_Input signal 214. For example, the frequency meter circuit may be a circuit that measures the frequency ratio between two clocks (the JIT_OUT signal 238 and the Jitter_Clock_Input signal 214).

The oscillator 200 and the counting circuit 300 can be used to measure both jitter and the duty cycle of the signal 214 (Jitter_Clock_Input). To measure jitter, the delay value of the delay select register 222 is set so that the delay line has a total delay of one period of the signal 214, and the output of the delay line, the signal 238, is captured at positive edges. To measure duty cycle, the delay value of the delay select register 222 is set so that the delay line has a total delay approximately equal to the high time of one period of the signal 214, and the output of the delay line is captured at negative edges. In both cases, the value set on the delay register 222 is varied to increase or decrease the amount of delay on the delay line from the initial setting. For each varied setting, the number of times that the second flip-flop 306 toggles can be counted over a given number of clock cycles of the signal 214. The results can be plotted in a histogram showing the number of toggles (or a percentage of toggles or other measure) for each delay setting.

For purposes of illustration, consider the following example. Initially, the flip-flops and signals of the counting circuit 300 are in a zero state. A positive edge arrives on the signal 214. The first flip-flop 302 captures a zero, and the second flip-flop 306 does not toggle. The positive edge begins to travel through the delay line 240. When the next positive edge arrives on the signal 214, one of two things can happen. Either the first positive edge has arrived at the first flip-flop 302 so that a one is captured and the second flip-flop 306 toggles, or it has still not arrived at the first flip-flop 302, a zero is captured and the second flip-flop 306 does not toggle.

Whether or not the first positive edge has arrived depends on the value in the delay select register 222, the period of the signal 214, and the amount of jitter on the signal 214. If the delay line 240 is configured to match the period of the signal 214, then any clock cycle with jitter such that the period of that clock cycle is longer than the delay path through the delay line 240 will result in a capture of a one, and any clock cycle with jitter such that the period of that clock cycle is shorter than the delay path will result in the capture of a zero.

By sweeping the length of the delay line around an initial delay length matching the period of the clock, and for each setting, counting the number of times the JIT_OUT signal 308 toggles for a given number of clock cycles, jitter can be measured. The jitter is indicated by what a portion of the clock cycles have a period that is longer than the total delay of the delay line. By taking the difference between each consecutive measurement, the number of clock cycles that falls into the range given by the two consecutive delay settings can be determined. This can then be used to build a histogram showing the distribution of the clock jitter.

By sweeping the length of the delay line 240 around an initial delay length matching the high time of one period of the clock, and for each setting, counting the number of times the signal 308 toggles for a given number of clock cycles, the duty cycle of the signal 214 can be characterized. In some implementations, the resulting duty cycle characterization is plotted as a histogram.

Digital circuits sometimes rely on half-cycle paths of internal clocks, e.g., the logic path is timing constrained by the time from a rising clock edge to a falling clock edge, or vice versa. Optimal timing constraints rely on correct characterization of duty cycles produced by internal high-speed oscillators in a device. Some devices thus use pessimistic (non-optimal) timing constraints to ensure safe half-cycle operation. Since half-cycle paths can be short for high-speed logic, this constraint can limit the operating speed for the logic, or increase the area required on a chip to meet timing closure. Characterizing the duty cycle allows timing constraints to be relaxed for target devices using the oscillator 200 of FIG. 2. In some implementations, performance can be increased and area cost can be reduced.

Example Open Loop Process

Figure 4:
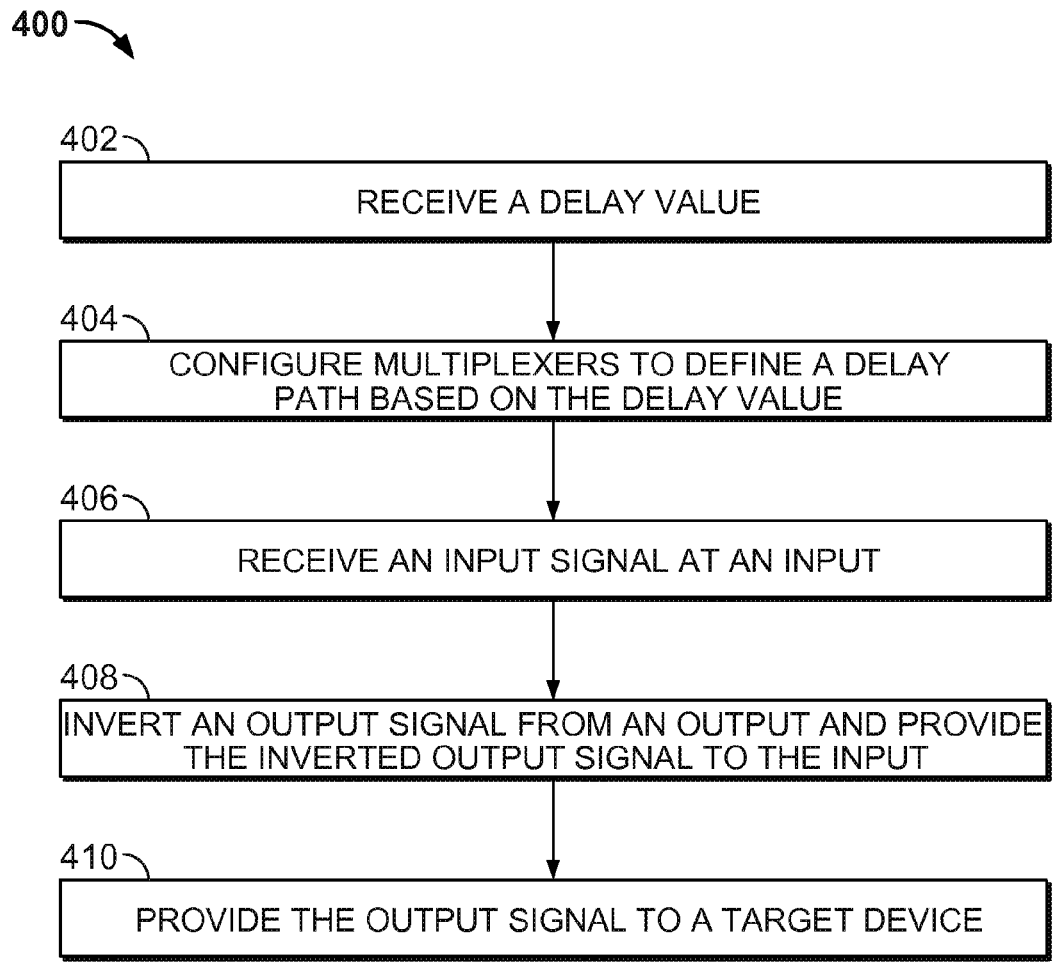
FIG. 4 is a flow diagram of an example process performed by the system of FIG. 1, including a delay line oscillator operating in an open loop mode.

FIG. 4 is a flow diagram of an example process 400 performed by a system including a delay line oscillator operating in an open loop mode. The delay line oscillator includes a plurality of delay elements connected in a cascade. Each delay element can include a standard cell selected from a library of standard cells. In some implementations, the delay elements are connected in the cascade from a first delay element to a last delay element, and each delay element after the first delay element can be configured to time delay a signal by a time period that is a multiple of the time period of the prior delay element in the cascade (e.g., twice as long).

The system receives a delay value (step 402). For example, the delay value may be provided from a target device, e.g., a microcontroller. The delay value specifies an amount of delay for the delay line and thus a frequency for the delay line oscillator.

The system configures a delay path through the delay elements (step 404). The configuration can be implemented with multiplexers, where the multiplexers can be configured to add or remove a delay element from a delay path through the delay line. The delay path has a total delay based on the received delay value.

The system receives an input signal at an input (step 406). Initially, the input signal may be a high signal. The system inverts (e.g., using an inverter) an output signal from an output of the delay line. The output signal is the result of the input signal traveling through the delay line as configured by the multiplexers. The inverted output signal is provided to the input (step 408). The output signal is also provided to a target device, e.g., a microcontroller, which can comprise standard cells from the same library of standard cells for the delay elements. In some implementations, the inverted output signal is provided to the target device.

Example Closed Loop Process

Figure 5:
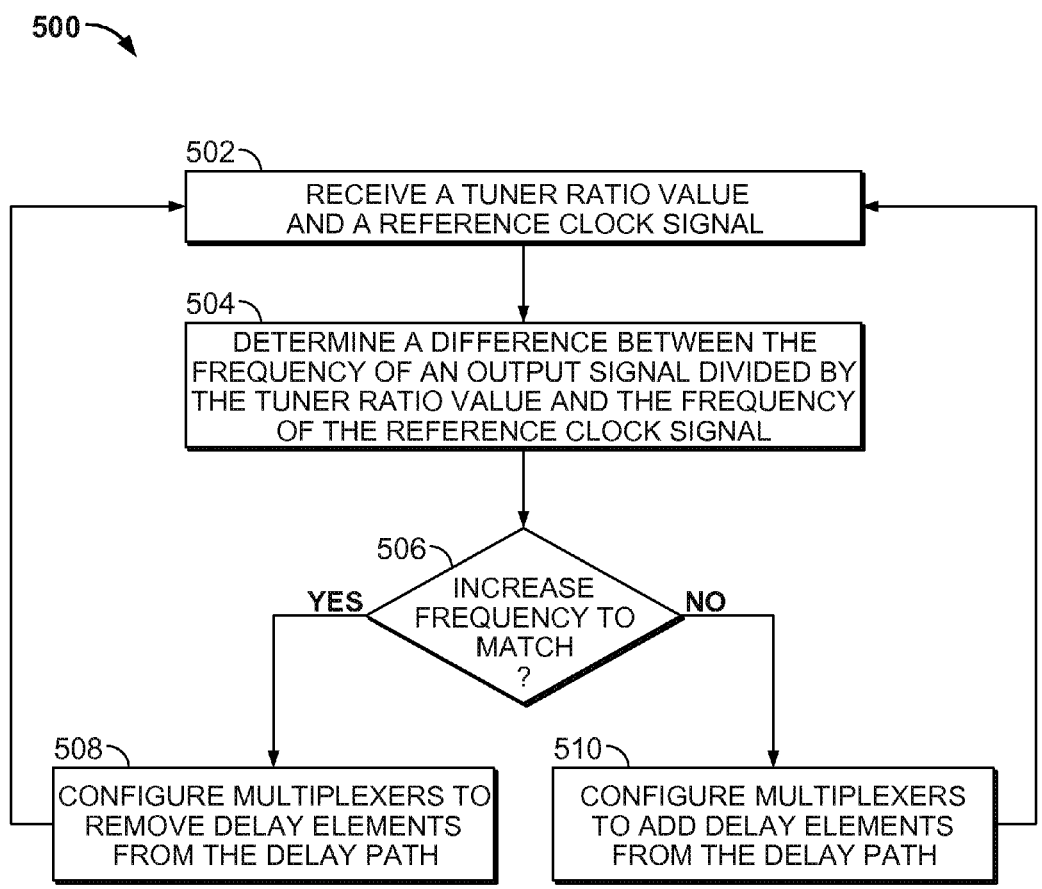
FIG. 5 is a flow diagram of an example process performed by the system of FIG. 1, including a delay line oscillator operating in a closed loop mode.

FIG. 5 is a flow diagram of an example process 500 performed by a system including a delay line oscillator operating in a closed loop mode. The delay line oscillator can include a plurality of delay elements connected in a cascade. Each delay element can include a standard cell selected from a library of standard cells. In some implementations, the delay elements can be connected in the cascade from a first delay element to a last delay element, and each delay element after the first delay element can be configured to time delay a signal by a time period that is a multiple of the time period of the prior delay element in the cascade.

The system receives a tuner ratio value and a reference clock signal (step 502). The system determines a difference between the frequency of an output signal from the delay line oscillator divided by the tuner ratio value and the frequency of the reference clock signal (step 504). If the frequency of the output signal divided by the tuner ratio value is less than the frequency of the reference clock signal (step 506), then the system increases the frequency of the delay line oscillator to match the reference clock signal and tuner value ratio. The system removes delay elements from the delay path of the delay line oscillator (step 508). If the frequency of the output signal divided by the tuner ratio value is greater than the frequency of the reference clock signal (step 506), then the system decreases the frequency of the delay line oscillator to match the reference clock signal and tuner value ratio. The system adds delay elements from the delay path of the delay line oscillator (step 510). The system repeats the process until the delay line oscillator is locked to a target frequency given by the frequency of the reference clock signal multiplied by the tuner ratio value. In some implementations, the system executes a binary search to lock the delay line oscillator to the target frequency.

Example Measurement Process

Figure 6:
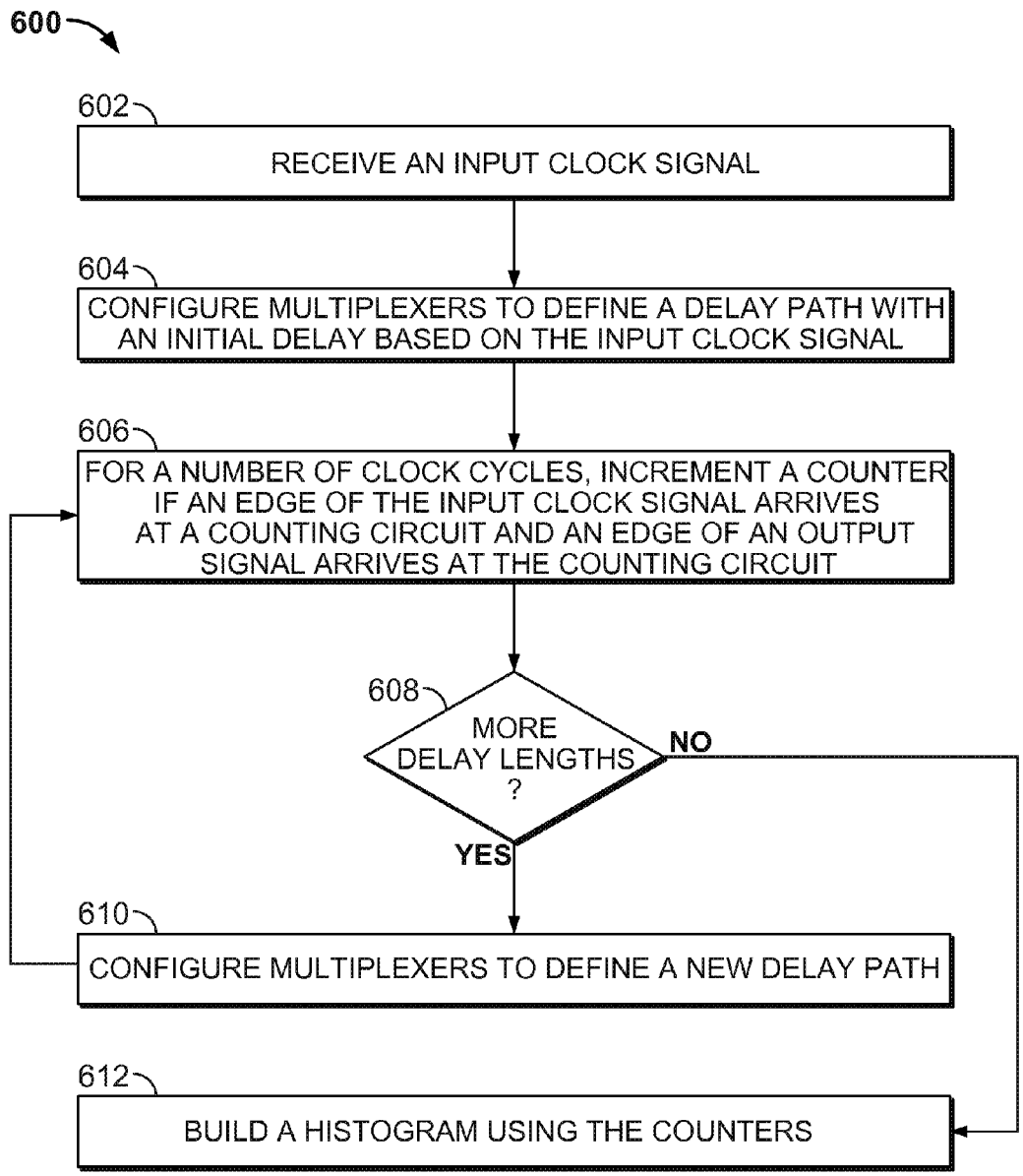
FIG. 6 is a flow diagram of an example process for characterizing the jitter or duty cycle of an input signal.

FIG. 6 is a flow diagram of an example process 600 for characterizing the jitter or duty cycle of an input signal. The process 600 can be performed by a system including a delay line. The delay line can include delay elements connected in a cascade. Each delay element can include one or more standard cells selected from a library of standard cells.

The system receives an input clock signal (step 602). The input clock signal is the signal to be characterized. The system configures a delay path with an initial delay based on the input clock signal (step 604). If the jitter on the input clock signal is being characterized, the initial delay can be the period of the input clock signal. If the duty cycle of the input clock signal is being characterized, the initial delay can be the high time of one period of the input clock signal.

For a number of clock cycles, the system increments a counter if an edge of the input clock cycle arrives at a counting circuit and an edge of an output signal from the delay line arrives at the counting circuit (step 606). Various counting circuits are possible. For example, the counting circuit 300 of FIG. 3 can be used. If the jitter on the input clock signal is being characterized, the edges are positive edges. If the duty cycle of the input clock signal is being characterized, the edges are negative edges.

The system determines whether more delay lengths should be tested (step 608). For example, a system test administrator may decide a number of delay lengths to be tested to sufficiently characterize the jitter or duty cycle of the input clock signal. The system then determines whether all of the specified delay lengths have been tested. If more delay lengths are to be tested, the system configures the multiplexers to define a new delay path for one of the delay lengths (step 610). The system then increments a new counter, for the same number of clock cycles, if an edge of the input clock cycle arrives at the counting circuit and an edge of an output signal from the delay line arrives at the counting circuit. In some implementations, the system builds a histogram using the counters for each of the configured delay lengths.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A method performed by a system comprising a delay line, the delay line comprising a plurality of delay elements connected in a cascade from a first delay element to a last delay element, the method comprising:
   receiving an input clock signal at an input to the delay line, the input clock signal having a period;
   configuring a plurality of selecting elements to define a delay path through the delay elements, the delay path having a total delay based on the period of the input clock signal, wherein:
      each delay element after the first delay element is configured to time delay the input clock signal by a time period that is a multiple of the time period of the prior delay element in the cascade; and
      the first delay element is configured to delay the input clock signal by a minimum time delay longer than a time delay between a delay select register configured to select between the selecting elements and the outputs of the selecting elements, the delay select register being configured to store a value indicative of the total delay of the delay path and output control signals to the plurality of selecting elements based on the stored value, the stored value being adjusted based on a frequency of an output signal of the delay line; and
   for a given number of clock cycles of the input clock signal, incrementing a first counter if an edge of the input clock signal arrives at a counting circuit and an edge of the output signal of the delay line arrives at the counting circuit, the counting circuit comprising two or more flip-flops, each of the two or more flip-flops being clocked by the input clock signal.

2. The method of claim 1, wherein the total delay of the delay path is one period of the input clock signal, and incrementing the first counter comprises incrementing the first counter if a positive edge of the input clock signal arrives at the counting circuit and a positive edge of the output signal arrives at the counting circuit.

3. The method of claim 1, wherein the total delay of the delay path is high time of one period of the input clock signal, and the incrementing the first counter comprises incrementing the first counter if a negative edge of the input clock signal arrives at the counting circuit and a negative edge of the output signal arrives at the counting circuit.

4. The method of claim 1, further comprising:
   configuring the selecting elements to increase the total delay of the delay path from an initial setting;

for the same number of clock cycles, incrementing a second counter if an edge of the input clock signal arrives at a counting circuit and an edge of the output signal arrives at the counting circuit;
configuring the selecting elements to decrease the total delay of the delay path from the initial setting; and
for the same number of clock cycles, incrementing a third counter if an edge of the input clock signal arrives at a counting circuit and an edge of the output signal arrives at the counting circuit.

5. The method of claim 4, further comprising building a histogram using the first, second, and third counters.

6. The method of claim 1, wherein the counting circuit comprises: a first flip-flop coupled to the input clock signal and the output signal; logic coupled to an output of the first flip-flop; and a second flip-flop directly coupled to the input clock signal and an output of the logic, wherein an output of the second flip-flop is coupled to the logic.

7. The method of claim 1, wherein each delay element comprises a standard cell selected from a library of standard cells.

8. A system comprising:
a delay line comprising a plurality of delay elements connected in a cascade from a first delay element to a last delay element; and
a plurality of selecting elements coupled to the delay line;
wherein the system is configured to perform operations comprising:
receiving an input clock signal at an input to the delay line, the input clock signal having a period;
configuring the selecting elements to define a delay path through the delay elements, the delay path having a total delay based on the period of the input clock signal, wherein:
each delay element after the first delay element is configured to time delay the input clock signal by a time period that is a multiple of the time period of the prior delay element in the cascade; and
the first delay element is configured to delay the input clock signal by a minimum time delay longer than a time delay between a delay select register configured to select between the selecting elements and the outputs of the selecting elements, the delay select register being configured to store a value indicative of the total delay of the delay path and output control signals to the plurality of selecting elements based on the stored value, the stored value being adjusted based on a frequency of an output signal of the delay line; and
for a given number of clock cycles of the input clock signal, incrementing a first counter if an edge of the input clock signal arrives at a counting circuit and an edge of the output signal of the delay line arrives at the counting circuit, the counting circuit comprising two or more flip-flops, each of the two or more flip-flops being clocked by the input clock signal.

9. The system of claim 8, wherein the total delay of the delay path is one period of the input clock signal, and incrementing the first counter comprises incrementing the first counter if a positive edge of the input clock signal arrives at the counting circuit and a positive edge of the output signal arrives at the counting circuit.

10. The system of claim 8, wherein the total delay of the delay path is high time of one period of the input clock signal, and the incrementing the first counter comprises incrementing the first counter if a negative edge of the input clock signal arrives at the counting circuit and a negative edge of the output signal arrives at the counting circuit.

11. The system of claim 8, the operations further comprising:
configuring the selecting elements to increase the total delay of the delay path from an initial setting;
for the same number of clock cycles, incrementing a second counter if an edge of the input clock signal arrives at a counting circuit and an edge of the output signal arrives at the counting circuit;
configuring the selecting elements to decrease the total delay of the delay path from the initial setting; and
for the same number of clock cycles, incrementing a third counter if an edge of the input clock signal arrives at a counting circuit and an edge of the output signal arrives at the counting circuit.

12. The system of claim 11, the operations further comprising building a histogram using the first, second, and third counters.

13. The system of claim 8, wherein the counting circuit comprises: a first flip-flop coupled to the input clock signal and the output signal; logic coupled to an output of the first flip-flop; and a second flip-flop directly coupled to the input clock signal and an output of the logic, wherein an output of the second flip-flop is coupled to the logic.

14. The system of claim 8, wherein each delay element comprises a standard cell selected from a library of standard cells.

15. The method of claim 1, wherein the first delay element is not selectable.

16. The system of claim 8, wherein the first delay element is not selectable.

17. The method of claim 1, further comprising:
receiving a tuner ratio value and a reference clock signal; and
determining a difference between the frequency of the output signal divided by the tuner ratio value and the frequency of the reference clock signal,
wherein the stored value is adjustable based on the difference.

18. The method of claim 17, wherein the stored value is increased if the frequency of the output signal divided by the tuner ratio value exceeds the frequency of the reference clock signal, and
wherein the stored value is decreased if the frequency of the output signal divided by the tuner ratio value is less than the frequency of the reference clock signal.

19. The system of claim 8, wherein the stored value is adjusted based on a difference between the frequency of the output signal divided by a tuner ratio value and a frequency of the reference clock signal.

20. The system of claim 19, wherein the stored value is increased if the frequency of the output signal divided by the tuner ratio value exceeds the frequency of the reference clock signal, and
wherein the stored value is decreased if the frequency of the output signal divided by the tuner ratio value is less than the frequency of the reference clock signal.

* * * * *